United States Patent [19]

Izume et al.

[11] Patent Number: 5,080,218
[45] Date of Patent: Jan. 14, 1992

[54] VIBRATORY FEEDING APPARATUS

[75] Inventors: Takatomo Izume, Kuwana; Toshirou Shiraishi, Yokkaichi, both of Japan

[73] Assignee: Kabushiki Kaisha Toshiba, Kanagawa, Japan

[21] Appl. No.: 595,194

[22] Filed: Oct. 9, 1990

[30] Foreign Application Priority Data

Dec. 5, 1989 [JP] Japan .................................. 1-315558

[51] Int. Cl.⁵ ............................................. B65G 25/00
[52] U.S. Cl. .................................... 198/751; 198/762; 198/766
[58] Field of Search ................. 198/751, 761, 762, 766

[56] References Cited

U.S. PATENT DOCUMENTS

| | | | |
|---|---|---|---|
| 3,964,600 | 6/1976 | Vensel | 198/761 |
| 4,216,416 | 8/1980 | Grace | 198/751 X |
| 4,795,025 | 1/1989 | Doke et al. | 198/766 X |
| 4,811,835 | 3/1989 | Bullivant et al. | 198/762 |

*Primary Examiner*—D. Glenn Dayoan
*Attorney, Agent, or Firm*—Philip M. Shaw, Jr.

[57] ABSTRACT

In a vibratory parts feeder, an output power of an inverter supplying AC voltage to each vibration generator (electric power supplied to the vibration generator) or input power to the inverter is controlled so as to reach the maximum during the feeding operation so that the operational frequency is automatically adjusted to the resonant frequency. That is, upon increase or decrease of the operational frequency at predetermined intervals, the value of power supplied to each vibration generator or the inverter input power is obtained. The obtained value is compared with the last obtained value whose data is stored in a storage. When the present value is larger than the last value, the operational frequency is repetitively increased or decreased in the same direction that the present power varies relative to the last power while it is repetitively increased or decreased in the direction opposite to the direction that the present power varies relative to the last power when the present value is smaller than the last value. These frequency shifts are repetitively performed until a resonant frequency is obtained, and the feeding operation is performed at the obtained resonant frequency.

10 Claims, 12 Drawing Sheets

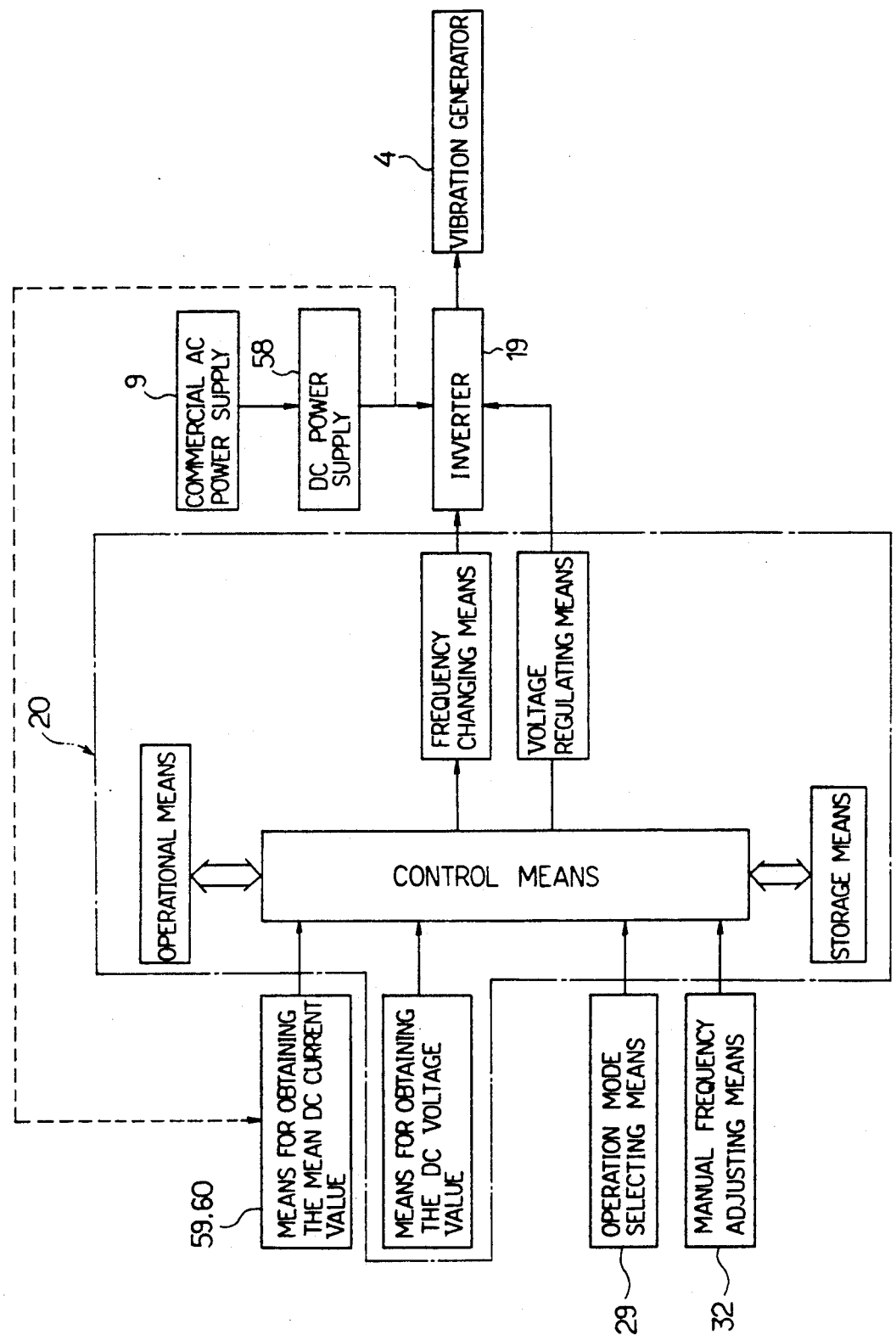

VIBRATORY FEEDING APPARATUS

BACKGROUND OF THE INVENTION

This invention relates to a vibratory feeding apparatus wherein an operational frequency during a feeding operation is controlled so as to be adjusted to a resonant frequency.

In conventional vibratory feeding apparatus, a vibration generator is mainly composed of an electromagnet or piezoelectric element. In each type feeding apparatus, the operational frequency needs to be adjusted to the resonant frequency in order that the maximum feeding efficiency is gained In this regard, a vibratory feeding apparatus provided with an operational frequency adjusting function has been developed. Japanese Laid-open Patent Application No. 62-218308 discloses such a vibratory feeding apparatus wherein a CR sine-wave generator with a potentiometer is employed for adjusting the operational frequency. Gradually varying the operational frequency with the potentiometer, an operator observes the variation of the operational frequency either or both of visually and auditorily to thereby search out the resonant frequency.

In accordance with the conventional arrangement, however, the adjustment of the operational frequency to the resonant frequency depends upon either or both of the operator's eyesight and auditory sense. Accordingly, it is difficult even for a skillful operator to precisely adjust the operational frequency to the resonant frequency and therefore, variations in the frequency adjustment results in a decline in the feeding efficiency of the vibratory feeding apparatus.

Furthermore, an experiment confirms that an allowable operational frequency range lies between ±0.2 Hz of the resonant frequency. Since the resonant frequency has the negative temperature dependency, the resonant frequency is decreased by 2 Hz when the ambient temperature is increased from 0° C. to 40° C. The reason for this is that the thermal expansion of the vibration system of the apparatus varies the elastic coefficiency.

On the other hand, a capacitor of the CR oscillator employed for operational frequency adjustment has the positive temperature dependency and consequently, an output frequency of the CR oscillator is increased by 2 Hz when the ambient temperature is increased from 0° C. to 40° C.

Thus, The temperature gradient of the temperature dependency of the vibration system is inverse relative to that of the CR oscillator side. Consequently, when the ambient temperature is changed by +5° C. even after the operational frequency is precisely adjusted to the resonant frequency at 20° C., the difference between the operational and resonant frequencies approximates 0.5 Hz, which value exceeding the allowable range of the operational frequency. This signifies that the operational frequency needs to be adjusted even when the ambient temperature is slightly changed. In theses circumstances, when the operational frequency adjustment is performed depending upon either or both of the operator's eyesight and auditory sense as described above, the adjustment will become troublesome and variations in the adjusted operational frequency is caused, resulting in reduction of the feeding efficiency of the vibratory feeding apparatus.

Additionally, when an amount of articles or load on a feeding means varies during the feeding operation, the vibration amplitude of the feeding means is accordingly varies, thereby varying the feeding speed. As a result, an input voltage to the vibration generator needs to be regulated in accordance with variation in the load but it is extremely difficult to manually regulate the input voltage to the vibration generator.

SUMMARY OF THE INVENTION

Therefore, an object of the present invention is to provide a vibratory feeding apparatus wherein the operational frequency can be automatically adjusted to the resonant frequency and the feeding operation can be performed at a suitable operational frequency or resonant frequency with ease and reliability.

Another object of the invention is to provide a vibratory feeding apparatus wherein the operational frequency can be precisely adjusted to the resonant frequency following the temperature changes during the feeding operation.

Further another object of the invention is to provide a vibratory feeding apparatus which can be operated at a predetermined feeding speed in spite of variations in the load amount.

Before describing the present invention, the following characteristics need to be understood with reference to FIG. 8. A vibratory acceleration curve has the same tendency as an applied electric power curve relative to the operational frequency and vice versa and the frequency of the peak vibratory acceleration also has the same tendency as the frequency of the peak applied power and vice versa. Based on these relationships, the frequency at which the peak applied electric power is reached is obtained by changing the operational frequency with the voltage applied to the vibration generator maintained at a predetermined value, and the obtained frequency corresponds to the resonant frequency.

The present invention utilizes the above-described relationships and provides a vibratory feeding apparatus comprising a DC power supply rectifying a commercial AC power to thereby supply a high DC voltage, inverter means for inverting the DC high voltage supplied from said DC power supply to an AC voltage, a plurality of vibration generators for generating vibrations when the AC voltage is applied thereto, feeding means vibrated by said vibration generators, thereby feeding articles, means for obtaining an effective value of the AC voltage applied to each said vibration generator, means for obtaining an effective value of an AC current flowing into each said vibration generator, means for obtaining the phase difference between the AC voltage and the AC current, operational means for obtaining electrical power supplied to each said vibration generator from the effective value of the AC voltage, the effective value of the AC current and the phase difference therebetween, storage means for storing data of the electrical power obtained by said operational means, frequency changing means for changing frequencies of the AC voltage applied to each said vibration generator, and control means for controlling the operation of the apparatus so that in an automatic setting mode, said operational means obtains the electrical power supplied to each said vibration generator after the frequency of the AC voltage is increased or decreased by said frequency changing means at predetermined intervals in the condition that the effective value of the AC voltage applied to each said vibration generator is rendered constant, thereby comparing the value obtained by said operational means with the last obtained value, the data of which is stored in said storage means, whereby the AC voltage frequency is repetitively increased or decreased in the same direction that the present obtained power varies relative to the last obtained power, when the present power value obtained by said operational means is larger than the last obtained power value and the AC voltage frequency is repetitively increased or decreased in the direction opposite to the direction that the present obtained power varies relative to the last obtained power, when the present obtained power value is smaller than the last obtained power value, thereby obtaining the resonant frequency at which the electric power supplied to each said vibration generator reaches the maximum so that a feeding operation is performed at the resonant frequency.

In accordance with the present invention, the adjustment of the operational frequency to the resonant frequency may be performed automatically and the feeding operation may be performed at the suitable operational frequency or resonant frequency with ease and reliability The invention may be applied to a case where the operation of the apparatus is controlled over an entire operation period in the automatic setting mode. The operation of adjusting the operational frequency to the resonant frequency is repetitively executed during the feeding operation. Accordingly, even when the change in the ambient temperature causes the resonant frequency to be increased or decreased, the operational frequency is automatically adjusted to the resonant frequency following the increase or decrease thereof due to the ambient temperature change.

Preferably, in the automatic setting mode, the voltage applied to each vibration generator is automatically regulated by voltage regulating means so that the obtained values of the electric power supplied to each vibration generator at the resonant frequency is constant in the automatic setting mode every time the resonant frequency is obtained. In this arrangement, where the power supplied to each vibration generator is constant, the vibratory acceleration is constant even if the load changes, as shown in FIG. 9. Consequently, the above-described voltage control maintains the applied voltage at a constant value, thereby rendering the feeding speed constant.

It is preferable that alarm means be provided for alarming when the resonant frequency is obtained.

Preferably, in the case of performing the feeding operation in a manual setting mode, the electric power supplied to the vibration generator is obtained every time the applied voltage frequency is adjusted by the manual frequency adjusting means, thereby determining whether or not the supplied electric power has reached the maximum. The alarming operation may be performed by the alarm means when the supplied electric power reaches the maximum or when the operational frequency is adjusted to the resonant frequency. In this arrangement, the alarming operation of the alarm means advantageously enables an operator to determine whether or not the operational frequency has been adjusted to the resonant frequency, with ease and reliability.

On the other hand, since the inverter input power reaches the maximum when the electric power supplied to each vibration generator or the inverter output power reaches the maximum, the control means may be arranged so as to control the inverter input power so that it reaches the maximum. The electric power supplied to each vibration generator or the inverter output power is controlled in this control manner so as to reach the maximum, thereby automatically adjusting the operational frequency to the resonant frequency.

In this control manner, the feeding operation is controlled over its entire period in the automatic setting mode. Alternatively, in the automatic setting mode, the voltage applied to each vibration generator is automatically regulated by voltage regulating means so that the obtained value of the electric power supplied to each vibration generator at the resonant frequency is constant every time the resonant frequency is obtained, thereby stabilizing the feeding speed.

In this control arrangement, the alarm means may be provided for alarming when the resonant frequency is obtained. Furthermore, in the manual setting mode, the inverter input power is obtained every time the inverter output frequency is adjusted, thereby determining whether or not the operational frequency is in accordance with the resonant frequency. The alarming means may be activated when the operational frequency is adjusted to the resonant frequency.

Other objects of the present invention will become obvious upon understanding of the illustrative embodiments about to be described or will be indicated in the appended claims. Various advantages not referred to herein will occur to one skilled in the art upon employment of the invention in practice.

BRIEF DESCRIPTION OF THE DRAWINGS

In the accompanying drawings:

FIG. 14 is a block diagram illustrating the functional arrangement of the bowl-shaped parts feeder.

DESCRIPTION OF THE PREFERRED EMBODIMENTS

A first embodiment in which the invention is applied to a bowl-shaped parts feeder will now be described with reference to FIGS. 1 to 11 of the drawings.

Figure 2:
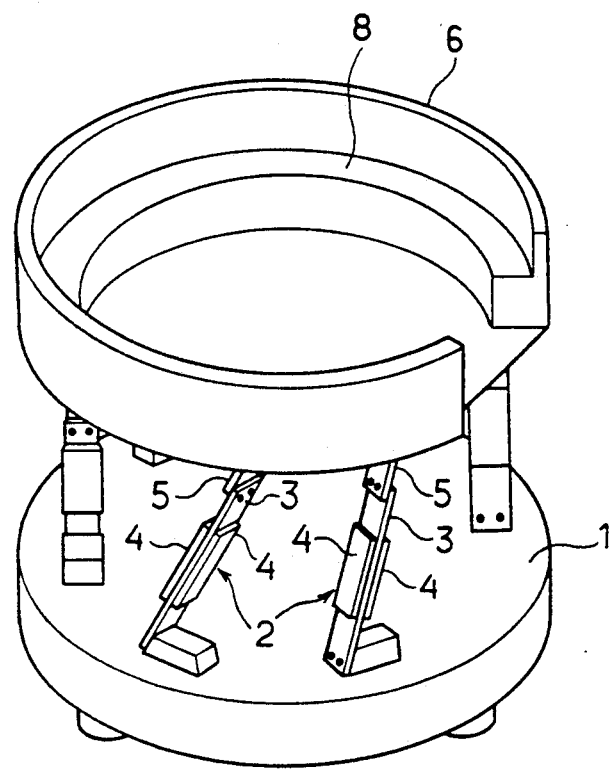
FIG. 2 is a perspective view of the bowl-shaped parts feeder.

Referring first to FIG. 2 showing the diagrammatic mechanical arrangement of the bowl-shaped parts feeder, a base 1 is formed into a shape of disc and a plurality of bimorph cell assemblies 2 are disposed with inclination on the same circumference at equal intervals on the base 1. Each bimorph cell assembly 2 comprises a leaf spring 3 and two piezoelectric elements 4 as vibration generators attached to both sides of the leaf spring 3, respectively. A feeder bowl 6 is coupled to the upper ends of the leaf springs 3 through respective vibration amplifying springs 5 and has a spiral passage 8 formed on the inside wall thereof. An AC voltage is applied to both piezoelectric elements 4 of each bimorph cell assembly 2 so that both elements 4 have opposite directions of polarization. Consequently, each bimorph cell assembly 2 repeats the bending such that the feeder bowl 6 is vibrated in the spiral direction or obliquely upward and downward relative to the circumferential direction, thereby feeding the articles along the spiral passage 8.

Figure 1:
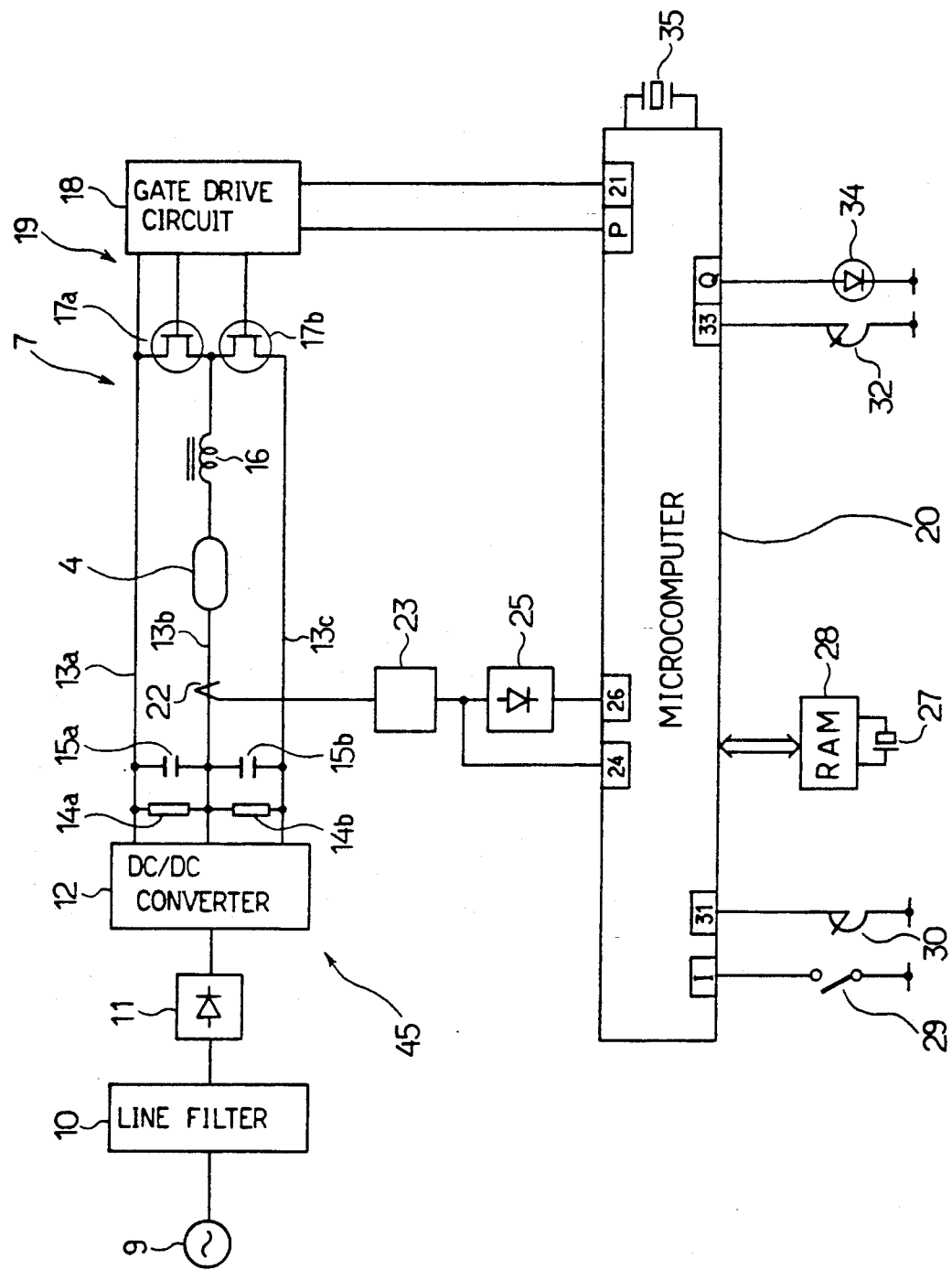
FIG. 1 is a circuit diagram showing an electrical arrangement of a bowl-shaped parts feeder in accordance with a first embodiment of the invention.

Drive means 7 will now be described with reference to FIG. 1. An electric power is supplied to a rectifier 11 through a noise removing line filter 10 from a commercial single-phase AC supply of AC 100 or 200 volts. The rectifier 11 comprises a single-phase full-wave bridge rectifier circuit and the AC voltage is full-wave rectified by the rectifier 11 to a DC voltage, which voltage is supplied to a DC/DC converter 12. The DC/DC converter 12 comprises a ringing choke converter (RCC) or flyback transformer type converter which steps up the full-wave rectified voltage to a high DC voltage of 700 volts. Two resistors 14a, 14b and capacitors 15a, 15b are connected in parallel among three output lines 13a, 13b and 13c of the DC/DC converter 12 such that the high DC voltage of 700 volts is divided into two power sources of +350 V and −350 V. Thus, a DC power supply is comprised of the line filter 10, rectifier 11 and DC/DC converter 12.

Each piezoelectric element 4 and short-circuit current preventing reactor 16 are connected in series to the central output line 13b. Sources and drains of field effect transistors (FET's) 17a and 17b serving as switching elements are connected between the reactor 16 and output lines 13a and 13c. Gate signals are supplied to gates of FET's 17a, 17b from a gate drive circuit 18 such that FET's are alternately turned on and off, thereby applying an AC voltage to each piezoelectric element 2. One FET 17a is turned on in the manner of a pulse-width modulation (PWM) in a positive half cycle of the AC voltage and the other FET 17a is turned off. On the other hand, FET 17b is turned on in the manner of the pulse-width modulation in the negative half-cycle with FET 17b turned off. FET's 17a, 17b and the gate drive circuit 18 thus compose an inverter 19. An output signal from an output port P of a microcomputer 20 and output signal from a PWM circuit 21 provided in the microcomputer 20 are supplied to the gate drive circuit 18. An amplitude of the voltage applied to each piezoelectric element 4 is controlled by means of an output signal from PWM circuit 21, thereby generating a bipolar signal at the output port P. In this case, since 0.8×127=101.6 (microseconds) where the period of a clock signal of the PWM circuit 20 is 0.8 microseconds and the pulse width modulated width is 127, the PWM control may be performed at intervals of 101.6 microseconds (or 9.84 KHz). Accordingly, in this embodiment, the microcomputer 20 delivers sine wave data to the PWM circuit 21 and the bipolar signal from the output port P at intervals of 101.6 microseconds, thereby controlling the amplitude and frequency of the AC voltage applied to each vibration generator 4. The microcomputer 20 thus serves as voltage regulating means and frequency changing means.

A current transformer 22 is connected to the output line 13b of the DC/DC converter 12 so that the value of current flowing into each piezoelectric element 4 is detected. A current detection signal generated by the current transformer 22 is converted by a resistance 23 to a voltage value and then, supplied to both of a zero-cross detectable interrupt circuit 24 and an A/D converter 26 of the microcomputer 20 through a rectifier 25. The rectifier 25 is of a serial conversion type and has the conversion word length of 8 bits and the conversion period of 10 to 20 microseconds. The zero-cross detectable interrupt circuit 24 supplies the microcomputer 20 with a pulsed interrupt signal when at times t1, t2 and t3 when the level of an input signal to the circuit 24 is changed from negative to positive or from positive to negative. The reason for the rectification of the current detection signal by the rectifier 25 is that the A/D converter 26 is unipolar and that the result becomes the same in the positive polarity as in the negative when the effective value of AC current is obtained.

A random access memory (RAM) 28 backed up by a battery 27 is connected to the microcomputer 20 through a data bus so that data of the values of voltage applied to each vibration generator and frequency immediately before completion of the last feeding operation is stored.

An operation mode selecting switch 29 serving as mode selecting means is connected to an input port I of the microcomputer 20. An automatic setting mode is selected when the selecting switch 29 is turned on and a manual setting mode is set when the selecting switch 29 is turned off. A voltage regulating potentiometer 30 is connected to the A/D converter 31 of the microcomputer 20 so that the voltage applied to each piezoelectric element 4 is regulated in the manual setting mode. Another potentiometer 32 serving as manual frequency adjusting means is connected to an A/D converter 33 of the microcomputer 20 so that the operational frequency is adjusted to the resonant frequency in the manual setting mode. A display element 34 such as an LED serving as alarm means is connected to an output port Q of the microcomputer 20. The display element 34 is activated while the operational frequency is being adjusted to the resonant frequency in the manual setting mode. An oscillator circuit 35 delivers clock pulses to the microcomputer 20. Based on the clock pulses, the microcomputer 20 has the PWM circuit 21 generate PWM signals and obtains the phase difference between the applied voltage and current.

The control manner of the microcomputer 20 as control means will be described with reference to FIGS. 3 to 9. Principles of the control for adjusting the operational frequency to the resonant frequency will be first described with reference to FIG. 8. A vibratory acceleration curve has the same tendency as an applied electric power curve relative to the operational frequency and vice versa and the frequency of the peak vibrating acceleration also has the same tendency as the frequency of the peak applied power and vice versa. Based on these relationships, the frequency at which the peak applied electric power is reached is obtained by changing the operational frequency with the voltage applied to the vibration generator maintained at a predetermined value, and the obtained frequency corresponds to the resonant frequency.

Figure 9:
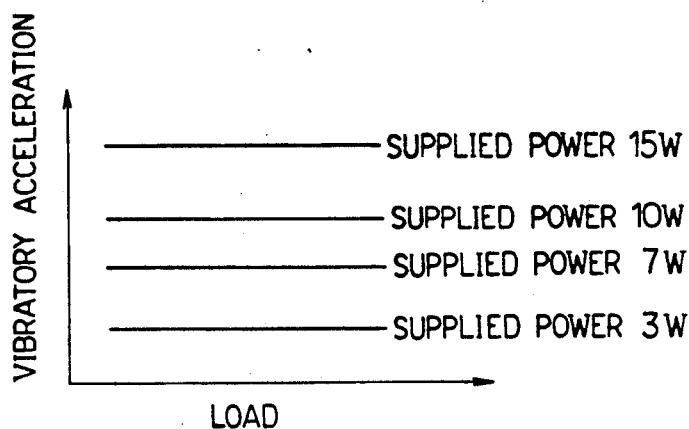
FIG. 9 is a graph showing the relationships between a load and vibratory acceleration and applied voltage.
Figure 10:
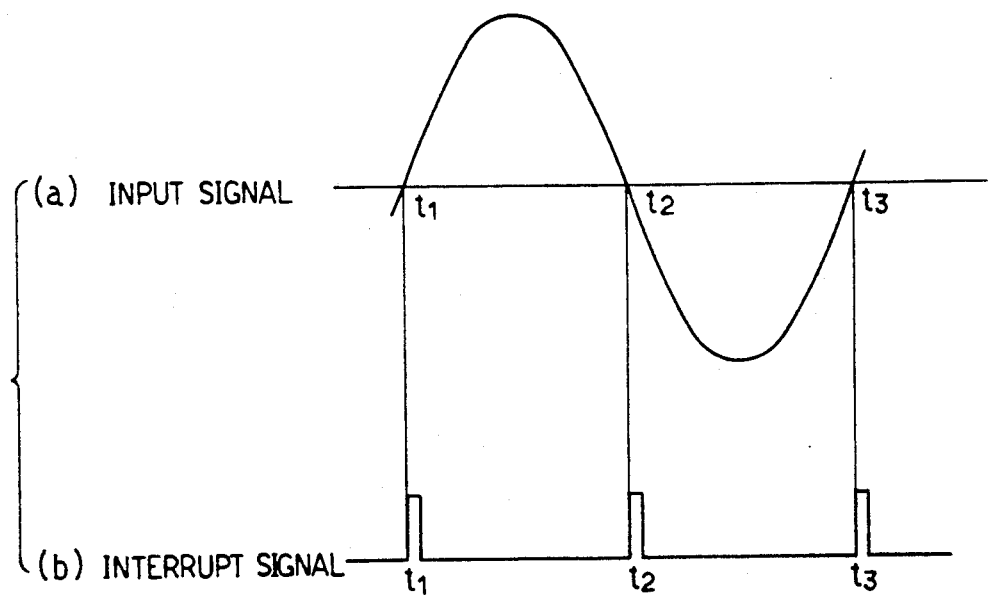
FIG. 10 is a waveform chart showing an input signal to an interrupt circuit with zero-cross detecting function and an interrupt signal.

Principles of the control for preventing variation of the feeding speed (vibratory acceleration) to thereby render the feeding speed constant is based on the fact that where the supplied electric power is constant, the vibratory acceleration is fixed even when the load is varied, as shown in FIG. 9.

When the feeding operation is performed in the automatic setting mode, the operation mode selecting switch 29 is turned on so as to be switched to "AUTO." Subsequently, when a start switch (not shown) is turned on, the feeding operation is initiated in the automatic setting mode in which the operational frequency is automatically adjusted to the resonant frequency as follows. In the automatic setting mode, every time one cycle of the AC voltage applied to each piezoelectric element 4 is completed, a CPU of the microcomputer 20 serving as operational means obtains the applied voltage $W_i$ in each one cycle (steps M1, M2). This calculation is performed in accordance with a subroutine shown in FIG. 4 and employs the following expression (1):

$$W_i = V_{rms} \times I_{rms} \times \cos \phi \qquad (1)$$

where $V_{rms}$ = effective value of applied voltage
$I_{rms}$ = effective value of current
$\cos \phi$ = power factor Since the applied voltage is regulated by the PWM circuit 21 of the microcomputer 20, the effective value of the applied voltage is set by the microcomputer 20 at step S1 and accordingly, a voltmeter or the like need not be employed for the voltage measurement. Consequently, the microcomputer 20 serves to obtain the effective value $V_{rms}$ of the applied voltage in the embodiment. Alternatively, the effective value $V_{rms}$ may be measured with a voltmeter or the like.

To obtain the effective value $I_{rms}$ of current flowing into each piezoelectric element 4, the microcomputer 20 executes sampling of value of current flowing into each piezoelectric element 4 for a predetermined sampling period (50 to 200 μs) via current transformer 22, resistance 23, rectifier 25 and A/D converter 26, at step S2. An obtained sampled data is squared and then added at predetermined times (N number of times) at step S3. The added value is divided by the number N at step S4 and the squared root of the divided value is extracted, thereby obtaining the current effective value $I_{rms}$ at step S5. Furthermore, to obtain the power factor $\cos \phi$, The zero-cross time $t_v$ of the applied voltage is detected at step S6 and the zero-cross time $t_i$ of an input current measured though the zero-cross detectable interrupt circuit 24 is detected at step S7. Then, the difference $|t_v - t_i|$ between these zero-cross times $t_v$ and $t_i$ is obtained at step S8 and the obtained difference is converted to a phase difference $\phi$ at step S9, thereby obtaining the power factor $\cos \phi$ at step S10. Alternatively, values of $\cos \phi$ relative to $\phi$ are previously tabled and stored in a read only memory (ROM) provided in the microcomputer 20. The value of $\cos \phi$ may be read from the data stored in the ROM.

The supplied electric power $W_i$ is obtained from the effective voltage value $V_{rms}$, effective current value $I_{rms}$ and power factor $\cos \phi$ in accordance with the expression (1) every time one cycle of the supplied electric voltage is completed, at step S11. The obtained values of applied power $W_i$ in the predetermined cycles (N number of times) are cumulatively added at steps M3 and M4 in FIG. 3. Every time the predetermined cycle is completed, the added value W of the supplied electric power $W_i$ is divided by the predetermined number N, thereby obtaining a mean value $W_n$ of the supplied electric power at step M5.

Figure 5:
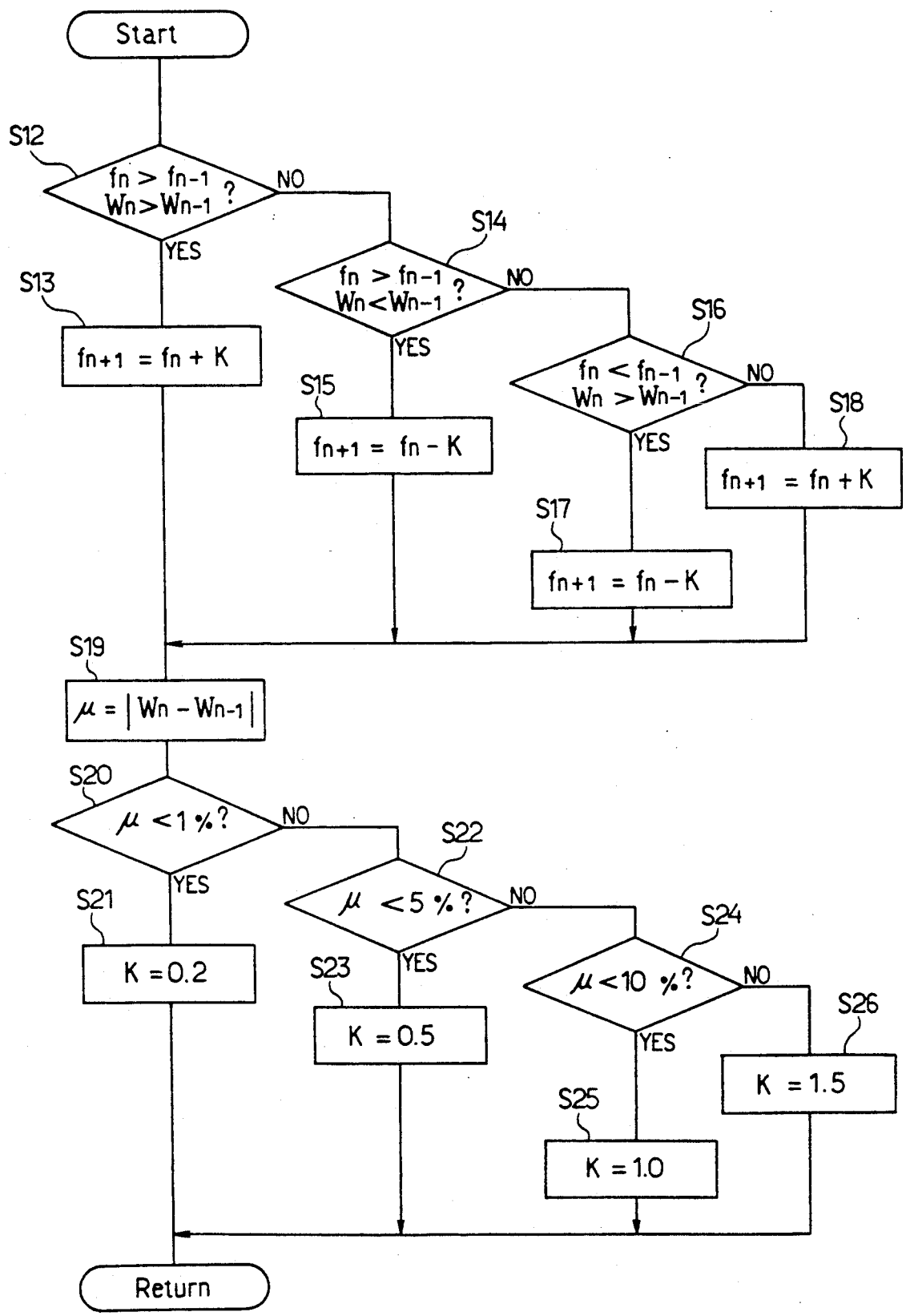
FIG. 5 is a flowchart of a routine for the frequency processing.

Thereafter, it is determined at step M6 whether or not the last processing has been performed in accordance with the frequency processing routine or the last processing flag F=1. The frequency and amplitude processing routines are alternately executed at steps M7 and M8. FIG. 5 illustrates the frequency processing routine in the step M7. In order that the operational frequency follows up the resonant frequency or to obtain the peak value of the supplied electric power, the frequency processing routine is executed in such a manner as follows. It is determined whether or not $f_n > f_{n-1}$ and $W_n > W_{n-1}$ at step S12 where $W_n$ = present supplied electric power (mean value) and $W_{n-1}$ = the last supplied electric power (mean value). When it is determined at step S12 that $f_n > f_{n-1}$ and $W_n > W_{n-1}$, the next operational frequency $f_{n+1}$ is set at $f_{n+K}$ (K representing the frequency variation described later) at step S13.

On the other hand, when it is not determined at step S12 that $f_n > f_{n-1}$ and $W_n > W_{n-1}$, the microcomputer 20 advances to step 14, where is is determined whether or not $f_n > f_{n-1}$ and $W_n < W_{n-1}$. When it is determined that $f_n > f_{n-1}$ and $W_n < W_{n-1}$, the operational frequency $f_{n+1}$ is set at $f_n$-K at step S15. On the other hand, when it is not determined that $f_n > f_{n-1}$ and $W_n < W_{n-1}$, the microcomputer 13 then advances to the step S16, where it is determined whether or not $f_n < f_{n-1}$ and $W_n > W_{n-1}$. When it is determined at step S16 that $f_n < f_{n-1}$ and $W_n > W_{n-1}$, the next operational frequency $f_{n+1}$ is set at $f_n + K$. When it is not determined that $f_n < f_{n-1}$ and $W_n < W_{n-1}$, the next operational frequency $f_{n+1}$ is set at $f_n + K$ at step S18. The operational frequency is successively approximated by performing the above-described steps S12 to S18 or the supplied electric power is successively increased.

Subsequently, the difference μ between the present supplied electric power $W_n$ and last supplied electric power $W_{n-1}$ is obtained at step S19. The frequency variation K is changed in accordance with the rate of the power difference μ relative to the supplied electric power $W_n$ in the following manner, thereby accelerating detection of the resonant frequency or peak value of the applied voltage. That is, the variation K is set at 0.2 where μ<1% at steps S20, S21. The variation K is set at 0.5 where 1%≦μ<5% at steps S22, S23 and at 1.0 where 5%≦μ<10% at steps S24, S25. Where μ≧10%, the variation K is set at 1.5 at step S29.

Figure 6:
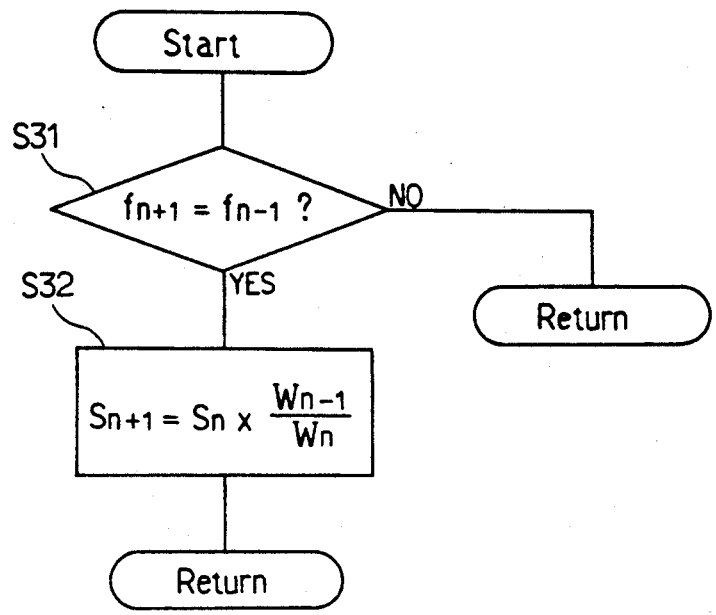
FIG. 6 is a flowchart of a routine for the amplitude processing.
Figure 8:
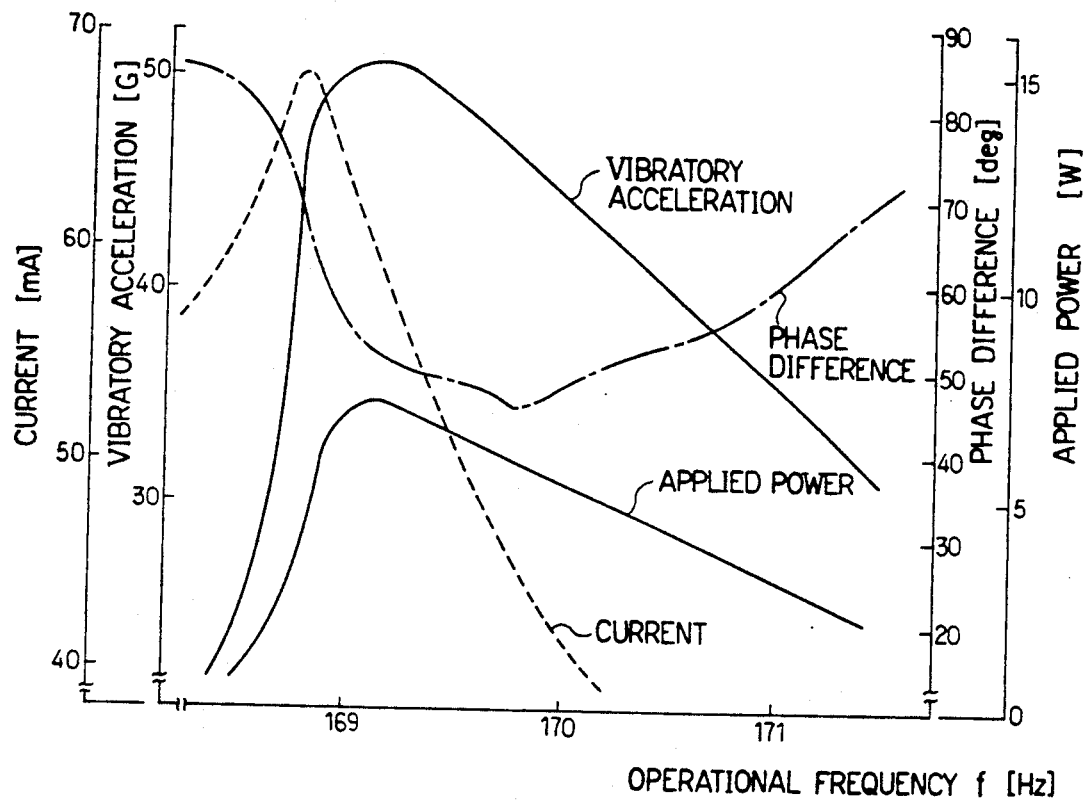
FIG. 8 is a graph showing the relationships between the operational frequency and applied voltage, vibratory acceleration, current and phase difference.

The microcomputer 20 then returns to the main routine shown in FIG. 8. At step S9, the last processing flag F is set to "1" and the amplitude processing routine is performed at steps M6 and M8. In the amplitude processing routine, as shown in FIG. 6, the following processing is performed so that the supplied electric power is rendered constant for the purpose that the feeding speed is constant. It is determined at step S31 whether or not the operational frequency is adjusted to the resonant frequency or $f_{n+1} = f_{n-1}$. The operational frequency is adjusted to the resonant frequency for the following reason when $f_{n+1} = f_{n-1}$. The peak value of the supplied electric power $W_n$ at the present operational frequency $f_n$(or $f_{n-1}+K$) is shifted where the supplied electric power $W_{n-1}$ reaches the peak value at the last frequency $f_{n-1}$. In the frequency processing routine, the next operational frequency $f_{n+1}$ is returned to the former frequency value (resonant frequency).

Figure 3:
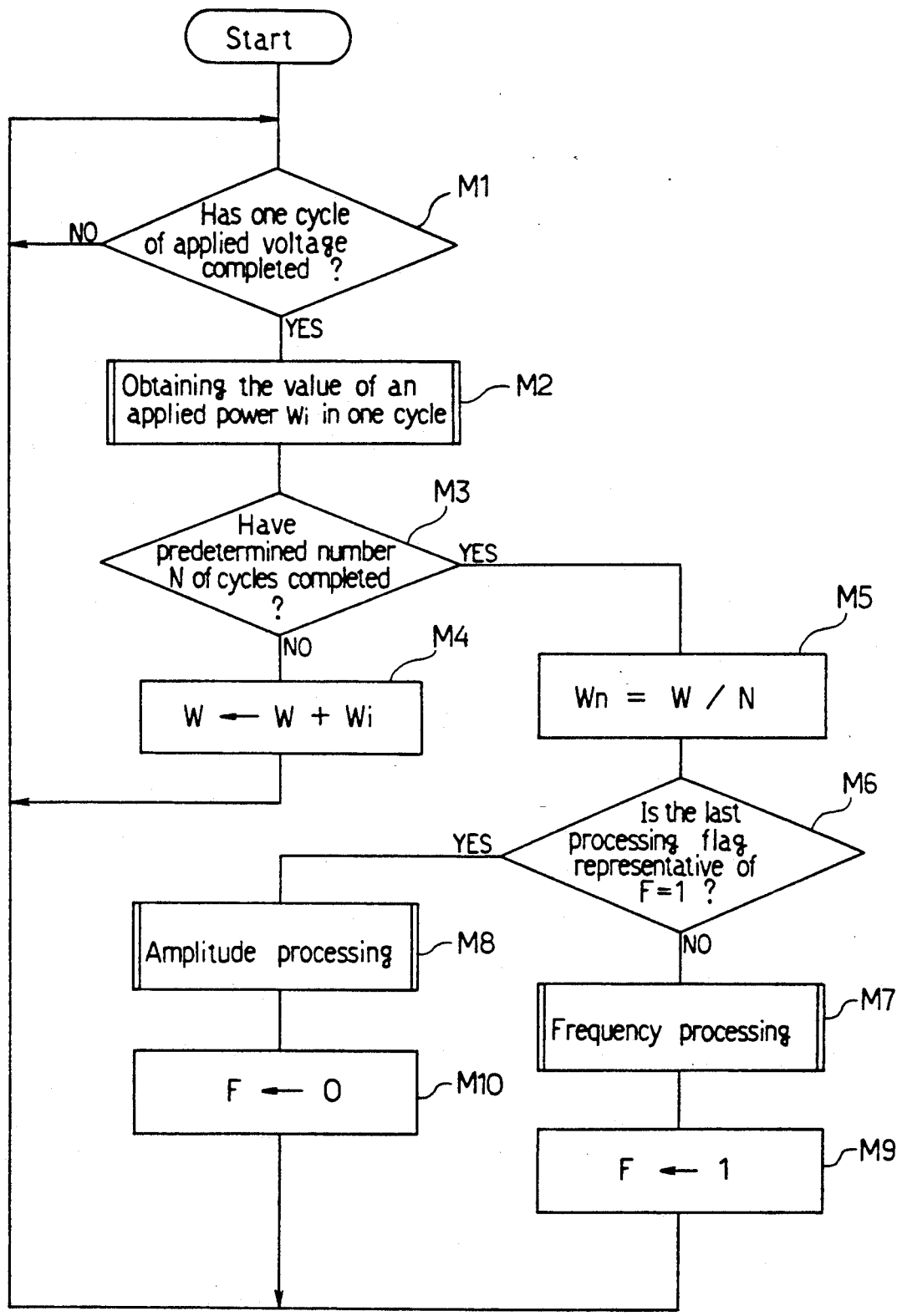
FIG. 3 is flowchart of a main routine in a control program.
Figure 4:
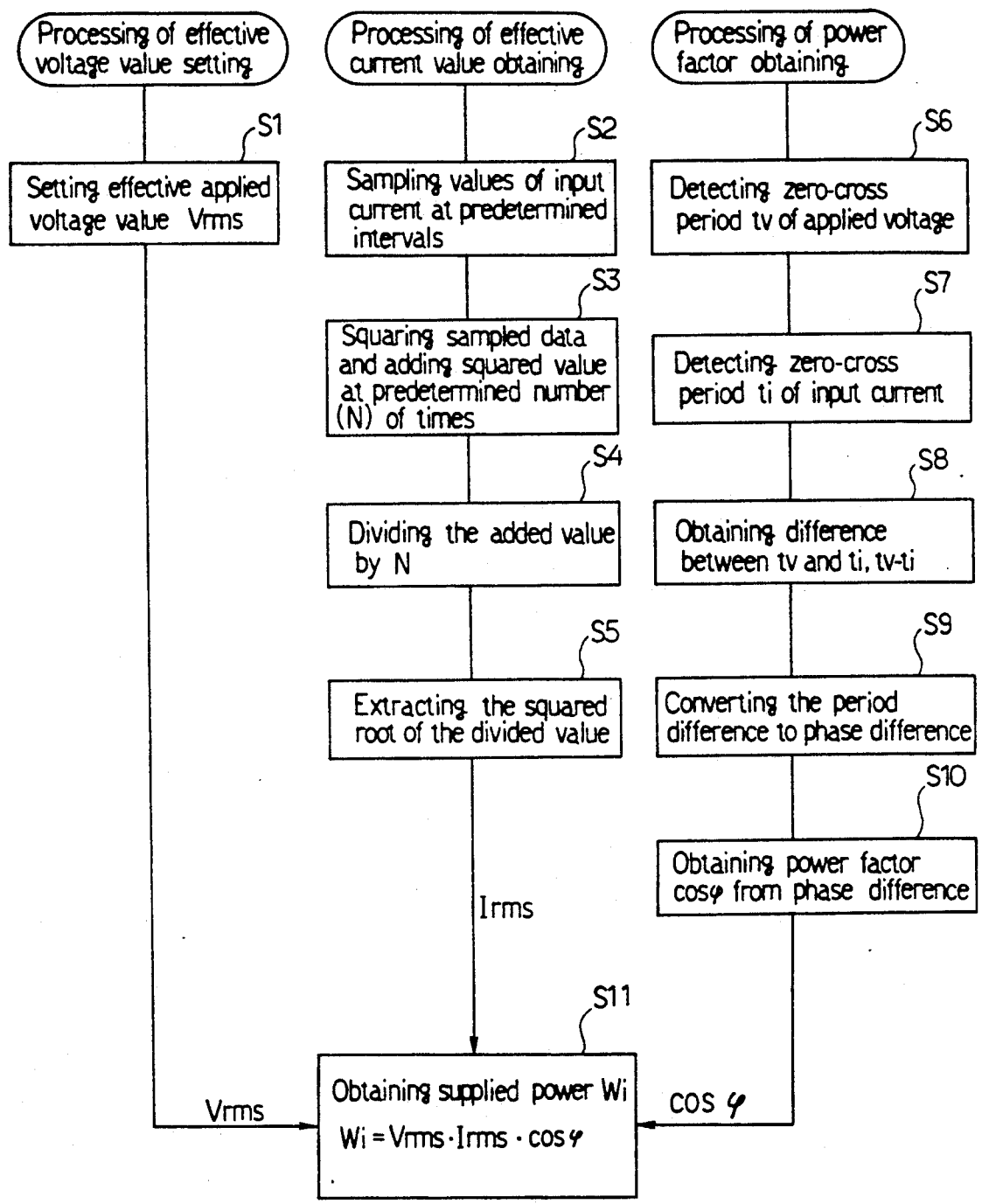
FIG. 4 is a flowchart of a routine for obtaining a supplied electric power.

When it is determined at step S31 that the operational frequency is not adjusted to the resonant frequency or $f_{n+1} \neq f_{n-1}$, the microcomputer 20 does not perform the amplitude processing routine and returns to the main routine shown in FIG. 3. The applied voltage is thus caused to remain constant until the operational frequency is adjusted to the resonant frequency, whereby the frequency processing routine in which the operational frequency is caused to gradually approximate to the resonant frequency is repeated in preference.

When it is determined at step 31 that the operational frequency is matched with the resonant frequency or when the supplied electric power reaches the maximum, the display element 34 is activated for alarming. The microcomputer 20 then advances to the step S32 in order that the supplied electric power remains constant such that the feeding speed remains constant In step S32, the next PWM output amplitude $S_{n+1}$ is obtained from the following expression (2)

$$S_{n+1} = S_n \times \frac{W_{n-1}}{W_n} \quad (2)$$

where $S_n$ = the present amplitude
$W_n$ = the present supplied electric power
$W_{n-1}$ = the last supplied electric power The voltage applied to each piezoelectric element 4 is adjusted by adjusting the PWM output amplitude in the manner as described above, thereby maintaining the supplied electric power (feeding speed) at a constant value. The microcomputer 20 returns to the main routine after the next amplitude $S_{n+1}$ is obtained and sets the last processing flag F at "0" at step M10. The microcomputer 20 then executes the frequency processing routine as described above for the next feeding operation at steps M6 and M7.

Figure 7:
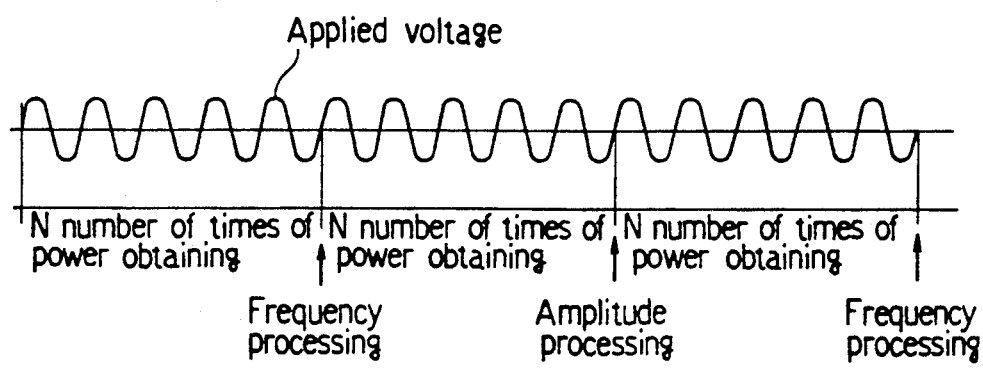
FIG. 7 is a timing chart of the processing routines.

FIG. 7 illustrates the timing for each above-described processing. Data of the supplied electric powers $W_{n-1}$, $W_n$ and operational frequencies $f_{n-1}$, $f_n$ obtained at the respective processing routines is stored in the RAM (not shown) as the storage means built in the microcomputer 20. Based on the stored data, the microcomputer 20 executes each processing routine.

The above-described control manner in the automatic setting mode is summarized as follows. The applied AC voltage frequency is gradually increased or decreased in the condition that the effective value of the AC voltage applied to each piezoelectric element 4 remains constant. Then, the value of the supplied electric power is obtained and the obtained value is compared with the last obtained value. The applied voltage frequency is repetitively increased or decreased in the same direction that the present obtained power varies relative to the last obtained power when the present obtained power value is larger than the last obtained power value while it is repetitively increased or decreased in the direction opposite to the direction that the present obtained power varies relative to the last obtained power when the present obtained power value is smaller than the last obtained power value. The frequency at which the supplied power reaches the maximum or the resonant frequency is obtained by repeating the frequency increase or decrease as described above, whereby the feeding operation is performed at the resonant frequency. Consequently, since the adjustment of the operational frequency to the resonant frequency may be automatically performed, the feeding operation may be performed at the suitable operational frequency or resonant frequency with ease and reliability.

Furthermore, the operational frequency is continuously adjusted to be in accordance with the resonant frequency, over an entire period of the feeding operation. As a result, even when the ambient temperature variation shifts the resonant frequency, the operational frequency is automatically adjusted following the shift of the resonant frequency. The ambient temperature change during the feeding operation or the resonant frequency shifting may be coped with and the feeding operation may be stabilized.

Every time the resonant frequency is obtained in the automatic setting mode, the PWM output amplitude (applied voltage is adjusted by the microcomputer 20 as voltage adjusting means so that values of applied power at the obtained resonant frequencies are constant. Consequently, the feeding speed (vibratory acceleration) may be rendered constant even when the load changes, thereby further stabilizing the feeding operation.

It takes a lot of time to adjust the operational frequency to the resonant frequency in the case where the operational frequency value is far apart from the resonant frequency in an initial stage of the feeding operation. In the above-described embodiment, however, the adjusting period may be reduced in the following manner. The RAM 28 backed up by the battery 27 is provided for storing data of the operational frequency and the PWM output amplitude (or applied voltage) immediately before completion of the last feeding operation. The next feeding operation is initiated with the operational frequency and PWM output amplitude set as the initial values, data of which is stored in the RAM 28. Since the RAM 28 is backed up by the battery 27, the stored data may be effective even when the power supply is cut. Accordingly, an electrically erasable/programmable read-only memory (EEPROM) or writable ROM may be employed instead of the RAM 28.

The operator may set the initial values of the operational frequency and applied voltage with the potentiometers 32, 30 respectively.

A manual setting mode in which the operational frequency and applied voltage are manually set will be described. When the operation mode select switch 29 is switched to "MANUAL" or turned off and then, the start switch (not shown) is turned on, the feeding operation is initiated in the manual setting mode. Subsequently, an operation knob of the operational frequency adjusting potentiometer 32 is gradually turned such that the operational frequency is gradually increased or decreased. As in the automatic setting mode, the value of the supplied electric power is obtained every time the operational frequency is increased or decreased by a predetermined amount. The obtained values are compared in turn with the last obtained value whose data is stored in the RAM of the microcomputer 20, thereby determining whether or not the supplied electric power has reached the maximum. When the supplied electric power reaches the maximum, the display element 34 is continuously lighted, thereby informing that the operational frequency has been adjusted to the resonant frequency. The display element 34 is slowly turned on and off when the operational frequency is lower than the resonant frequency while it is quickly turned on and off when the operational frequency is higher than the resonant frequency. Consequently, the operator may be informed in which direction a potentiometer slider is turned, which enables the operator to quickly adjust the operational frequency to the resonant frequency. The determination of whether the operational frequency is lower or higher than the resonant frequency depends upon whether the supplied electric power is increased or decreased when the operational frequency is increased or decreased.

As described above, in the manual setting mode, the operator adjusts the potentiometer 32 until the display element 34 starts continuously lighting. Accordingly, the manual frequency adjustment may be performed easily and accurately as compared with the prior art feeding apparatus wherein the adjustment depends upon either or both of operator's eyesight and auditory sense. A buzzer or speaker may be employed as means for informing of the completion of the frequency adjustment, instead of the display element 34.

In the case where the regulation of the applied voltage is performed under the manual setting mode, the potentiometer 30 for the applied voltage regulation is operated after the operational frequency is adjusted to the resonant frequency in the manner as described above.

Figure 12:
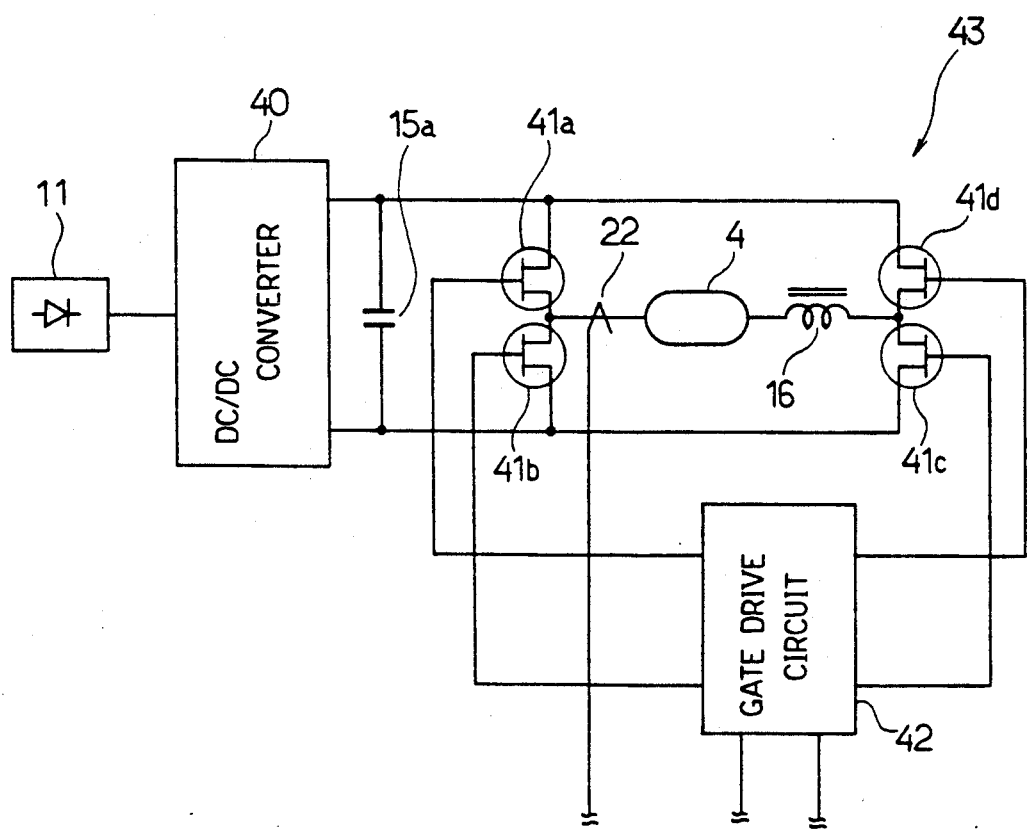
FIG. 12 is a circuit diagram of an inverter employed in the bowl-shaped parts feeder of a second embodiment.
Figure 11:
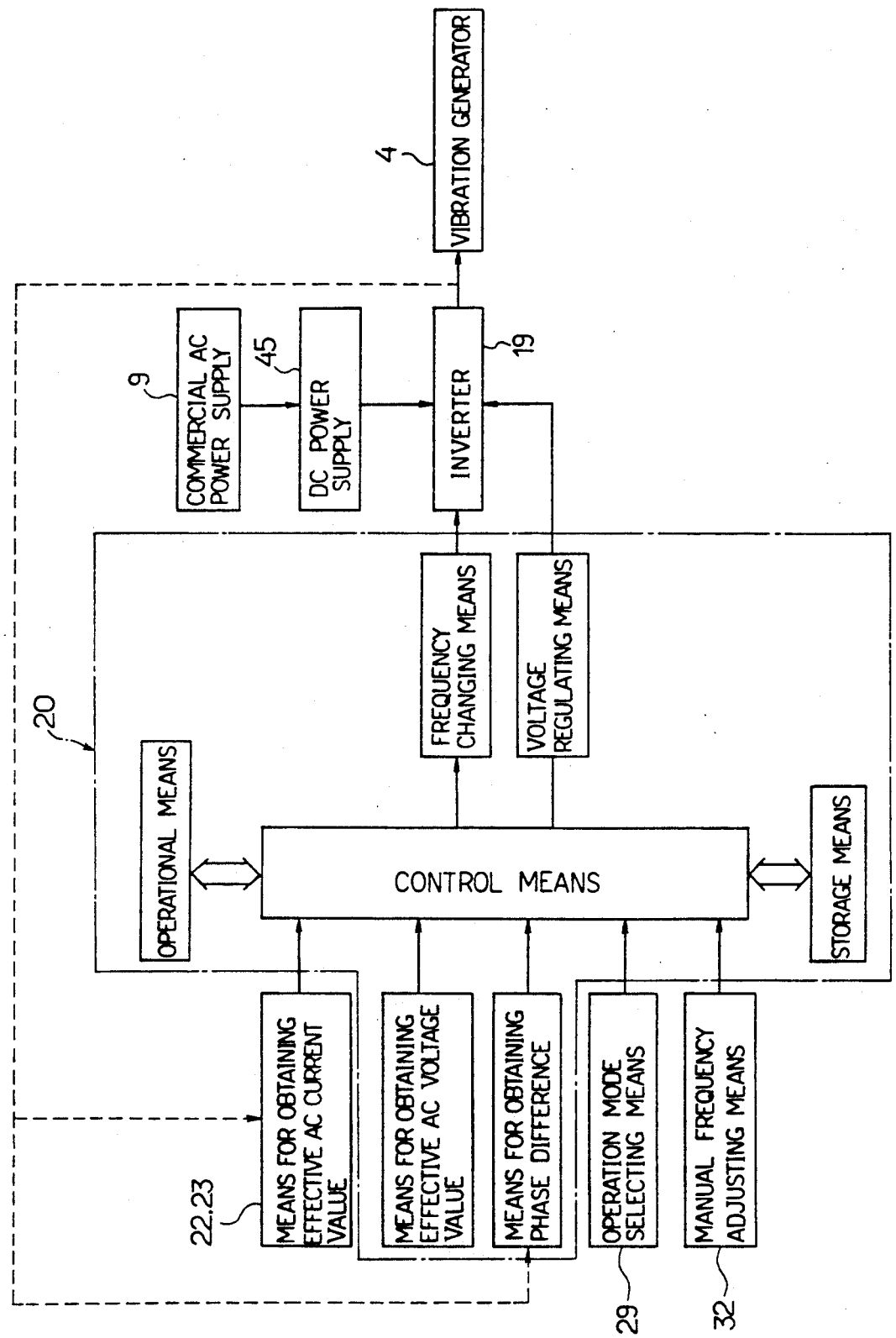
FIG. 11 is a block diagram illustrating the functional arrangement of the bowl-shaped parts feeder.

Since the output of the DC/DC converter 12 is divided into power supply +350 volts and power supply −350 volts, the switching element of the inverter 19 may be composed of two FET's 17a, 17b. On the other hand, FIG. 12 illustrates a second embodiment wherein the DC/DC converter 40 is arranged as a single power supply of +350 volts. In this arrangement, four FET's 41a–41d serving as the switching elements are connected into a bridge circuit. Each FET is driven by a gate drive circuit 42 and the AC voltage is applied to each piezoelectric element 4 by alternately turning on and off the FET's 41a, 41c and FET's 41b, 41d. The inverter 43 is thus comprised of the four FET's 41a–41d and gate drive circuit 42 controlled by the microcomputer 20.

Figure 13:
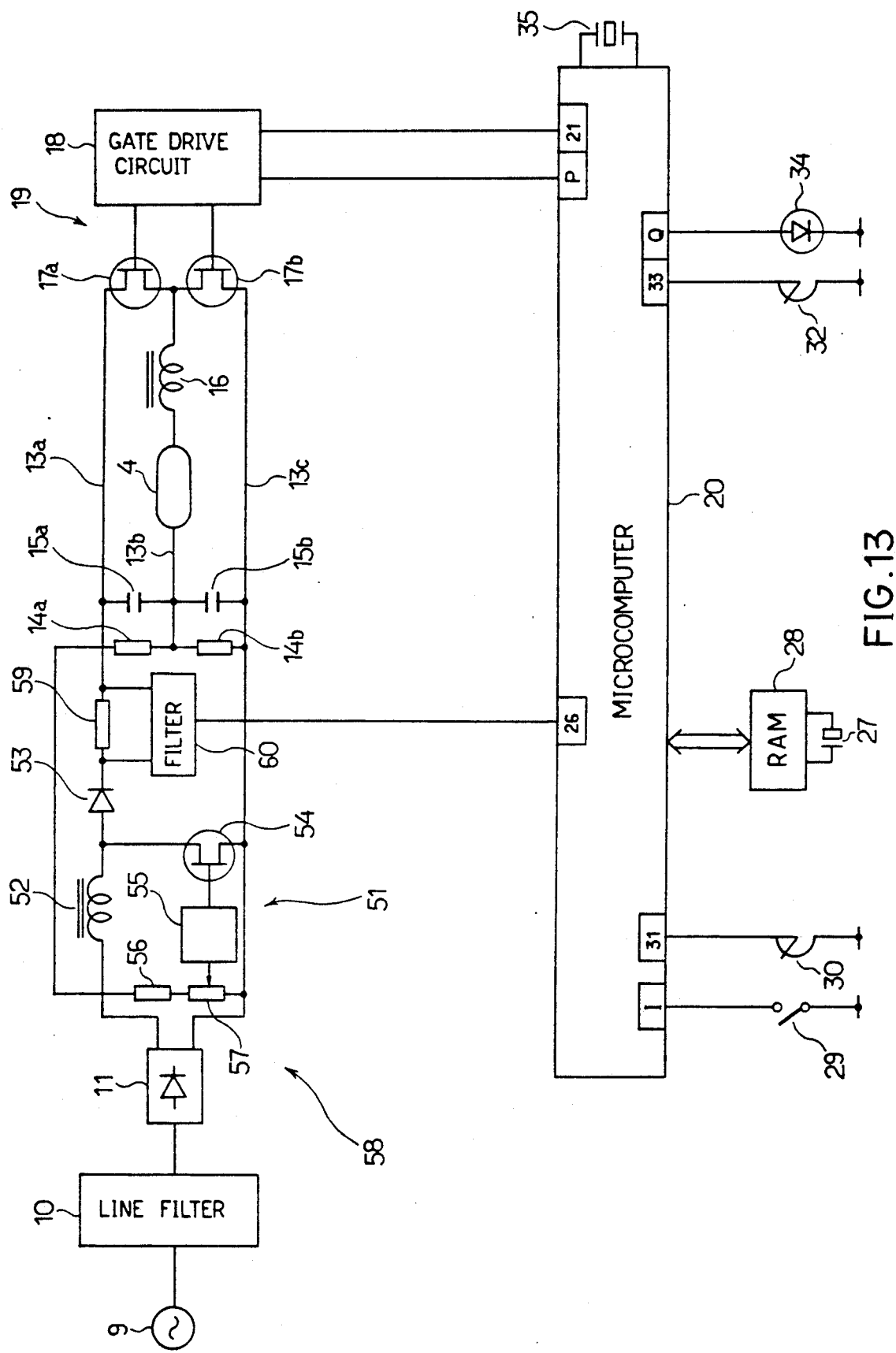
FIG. 13 is an electrical circuit diagram of the bowl-shaped parts feeder of a third embodiment.

FIGS. 13 and 14 illustrate a third embodiment of the invention. The same reference numerals are used to designate the identical parts in these figures as in the first embodiment. The DC/DC converter 51 comprises a smoothing reactor 52, diode 53, FET 54, PWM switching regulator 55 and two feedback resistances 56, 57. The reactor 52 is connected to one output terminal of the rectifier 11 and the source and drain of the FET 54 are connected between the reactor 52 and the other output terminal of the rectifier 11. An output terminal of the PWM switching regulator 55 is connected to the gate of the FET 54 so that the FET 54 is on-off controlled by an output signal of the regulator 54. More specifically, an output voltage of the DC/DC converter 51 is fed back to the PWM switching regulator 55 through the feedback resistances 56, 57 and based on the feedback input, the regulator 55 on-off controls the FET 54, thereby rendering the output voltage of the DC/DC converter 51 constant. The DC power supply 58 is comprised of the DC/DC converter 51, rectifier 11 and line filter 10.

A current detecting resistor 59 is connected to the output terminal of the DC/DC converter 51 so that the mean value of the DC current supplied to the inverter 19 is obtained. The DC current value is converted to the voltage value and detected by the resistor 59. The DC current detected by the resistor 59 is converted to a mean DC current value, which is supplied to the A/D converter 26 of the microcomputer 20.

The third embodiment has taken it into consideration the relationship between input and output of the inverter 19 that when the inverter output power reaches the maximum, the inverter input power also reaches the maximum. The inverter input power is controlled by the microcomputer 20 so as to reach the maximum and consequently, the power supplied to each piezoelectric element 4 or inverter output power reaches the maximum, thereby adjusting the operational frequency to the resonant frequency. In this regard, the microcomputer 20 serves as control means for controlling the power supplied to the inverter 19 so that the supplied electric power reaches the maximum, in such a manner as described later and as operational means for obtaining the value of the power supplied to the inverter 19 from the value of DC voltage applied to the inverter 19 and the mean value of the DC voltage applied thereto through the filter 60. Furthermore, the microcomputer 20 serves as storage means for storing data of the obtained values of the power supplied to the inverter 19 and as frequency changing means for changing the inverter output frequency.

The manner in which the microcomputer 20 obtains the power supplied to the inverter 19 will now be described. The microcomputer 20 inputs the data of the mean value of DC currents flowing into the inverter 19, through the filter 60 for a predetermined sampling period (50 to 200 $\mu$s). The microcomputer 20 then performs an operation that the DC/DC converter 51 output voltage (or DC voltage applied to the inverter 19) is multiplied by the mean DC current value, thereby obtaining the power supplied to the inverter. Since the output voltage of the DC/DC converter 51 is rendered constant by means of on-off control by the PWM switching regulator 55, it is obtained by reading out the data of inverter output voltage previously stored in the ROM built in the microcomputer 20 without measuring it by means of a voltmeter or the like. Consequently, the microcomputer 20 serves as means for obtaining the output voltage of the DC/DC converter 51 (or the DC voltage applied to the inverter 19) in the third embodiment. Alternatively, a voltmeter may be provided for that purpose.

Where the mean values of the DC current input by the microcomputer 20 at every sampling are represented as $I_1, I_2, \ldots, I_N$ and the DC/DC converter 51 output voltage (constant) as V, the mean value $W_n$ of power supplied to the inverter 19 sampled at N number of times is obtained from the following expression:

$$W_n = V (I_1 + I_2 + \ldots + I_N)/N \tag{3}$$

The same operations as in the steps M6 to M10 of the main routine (FIG. 3) in the first embodiment are performed after obtaining the mean value $W_n$ of the supplied electric power of the inverter 19. More specifically, the frequency processing routine (step M7) and amplitude processing routine (step M8) are alternately executed. In the frequency processing routine, after the output frequency of the inverter 19 is increased or decreased little by little at predetermined intervals, the microcomputer 20 obtains the power supplied to the inverter 19 (the mean value $W_n$). The obtained value $W_n$ is compared with the last obtained value $W_{n-1}$ whose data is stored in the ROM of the microcomputer 20. The inverter output frequency is increased or decreased in the same direction that the present obtained power varies relative to the last obtained power, when the present obtained value $W_n$ is larger than the last one, while it is increased or decreased in the direction opposite to the direction that the present obtained power varies relative to the last obtained power, when the present obtained value is smaller than the last one. Such a frequency increase or decrease is repetitively executed such that the resonant frequency at which the power supplied to the inverter 19 reaches the maximum is obtained. The feeding operation is performed at the obtained resonant frequency. The display element 34 is continuously lighted while the operational frequency is adjusted to the resonant frequency.

On the other hand, in the amplitude processing routine, the output voltage (or amplitude) of the inverter 19 is adjusted so that the power supplied to the inverter 19 becomes constant. Consequently, the feeding speed or the vibratory acceleration is prevented from being varied by the load variation, thereby rendering the feeding speed constant. When the power supplied to the inverter 19 becomes constant, the power supplied to each piezoelectric element 4 from the verter 19 also becomes constant. The same control as in the foregoing embodiment is thus performed.

In the third embodiment, too, the RAM 28 backed up by the battery 27 is provided for storing data of the operational frequency and the PWM output amplitude (or applied voltage) immediately before completion of the last feeding operation. The next feeding operation is initiated with the operational frequency and PWM output amplitude set as the initial values, data of which is stored in the RAM 28. Consequently, the operational frequency may be quickly matched with the resonant frequency.

The vibratory feeding apparatus of the third embodiment is provided with the operation mode selecting switch 29 as the mode selecting means for selecting either of the automatic and manual setting modes, the potentiometer 32 as the frequency adjusting means with which the operator adjusts the output frequency of the inverter 19 in the manual setting mode, and the display element 34 as alarm means for alarming while the feeding operation is performed at the resonant frequency. When the manual setting mode is selected, the microcomputer 20 obtains the power supplied to the inverter 19 every time the inverter output frequency is adjusted with the potentiometer 32. The obtained value is compared with the last obtained value whose data is stored in the RAM of the microcomputer 20, thereby determining whether or not the power supplied to the inverter has reached the maximum. The display element 34 is continuously lighted at the time the inverter supplied power reaches the maximum, thereby informing that the operational frequency has been adjusted to the resonant frequency. When the operational frequency is lower than the resonant frequency, the display element 34 is flashed at relatively long intervals, as in the first embodiment, while it is flashed at relatively short intervals when the operational frequency is higher than the resonant frequency. As a result, the operator may be informed whether the potentiometer 32 should be operated so that the frequency is increased or decreased, which provides the quick manual adjusting.

When the piezoelectric element input voltage is regulated in the manual setting mode, the input voltage adjusting potentiometer 30 is operated to set the input voltage to a suitable value after the operational frequency is matched with the resonant frequency, as described above.

The feeding operation may be performed in the automatic setting mode only at a stage of the start thereof, and after the operational frequency is adjusted to the resonant frequency, the operation may be performed with the operational frequency fixed. If the ambient temperature does not change, the resonant frequency is not varied. Accordingly, where the ambient temperature is maintained at a predetermined value, the frequency adjustment is not necessitated during the feeding operation. Furthermore, only when the operator determines that the frequency adjustment is needed because of the change in the ambient temperature or for other reason, the feeding operation may be performed in the automatic setting mode until the operational frequency is adjusted to the resonant frequency in the manual setting mode.

The invention may be applied to in-line parts feeders other than the bowl-shaped parts feeders as described above. Furthermore, the invention may be applied to the feeding apparatus wherein electromagnet is employed as the drive source instead of the piezoelectric element.

The foregoing disclosure and drawings are merely illustrative of the principles of the present invention and are not to be interpreted in a limiting sense. The only limitation is to be determined from the scope of the appended claims.

What we claim is:

1. A vibratory feeding apparatus comprising:
    a) a DC power supply rectifying a commercial AC voltage to thereby supply a DC high voltage;
    b) inverter means for inverting the DC high voltage supplied from said DC power supply to an AC voltage;
    c) a plurality of piezoelectric elements for generating vibrations when the AC voltage is applied thereto;
    d) feeding means vibrated by said piezoelectric elements, thereby feeding articles;
    e) means for obtaining an effective value of the AC voltage applied to each said piezoelectric element;
    f) means for obtaining an effective value of an AC current flowing into each said piezoelectric element;
    g) means for obtaining the phase difference between the AC voltage and the AC current;
    h) operational means for obtaining electric power supplied to each said piezoelectric element from the effective value of the AC voltage, the effective value of the AC current and the phase difference therebetween;
    i) storage means for storing data of the electric power obtained by said operational means;
    j) frequency changing means for changing frequencies of the AC voltage applied to each said piezoelectric element; and
    k) control means for controlling the operation of the apparatus so that in an automatic setting mode, said operational means obtains the electric power supplied to each said piezoelectric element after the frequency of the AC voltage is increased or decreased by said frequency changing means at predetermined intervals in the condition that the effective value of the AC voltage applied to each said piezoelectric element is rendered constant, thereby comparing the value obtained by said operational means with the last obtained value, the data of which is stored in said storage means, whereby the AC voltage frequency is repetitively increased or decreased in the same direction that the present obtained power varies relative to the last obtained power, when the present power value obtained by said operational means is larger than the last obtained power value and the AC voltage frequency is repetitively increased or decreased in the direction opposite to the direction that the present power varies relative to the last obtained power, when the present power value is smaller than the last obtained power value, thereby obtaining the resonant frequency at which the electrical power supplied to each said piezoelectric element reaches the maximum so that a feeding operation is performed at the resonant frequency.

2. A vibratory feeding apparatus according to claim 1, wherein said control means controls the operation of the apparatus over an entire operation period thereof in the automatic setting mode.

3. A vibration feeding apparatus according to claim 2, which further comprises voltage regulating means for regulating the voltage applied to each said piezoelectric element and wherein said control means controls said voltage regulating means so that the voltage applied to each said piezoelectric element is regulated so that the obtained values of the electric power supplied to each said piezoelectric element at the resonant frequency is constant in the automatic setting mode every time the resonant frequency is obtained.

4. A vibratory feeding apparatus comprising:
a) a DC power supply rectifying a commercial AC power to thereby supply a DC high voltage;
b) invertor means for inverting the DC high voltage supplied from said DC power supply to an AC voltage;
c) a plurality of vibration generators for generating vibrations when the AC voltage is applied thereto;
d) feeding means vibrated by said vibration generators, thereby feeding articles;
e) means for obtaining an effective value of the AC voltage applied to each said vibration generator;
f) means for obtaining an effective value of an AC current flowing into each said vibration generator;
g) means for obtaining the phase difference between the AC voltage and the AC current;
h) operational means for obtaining electric power supplied to each said vibration generator from the effective value of the AC voltage, the effective value of the AC current and the phase difference therebetween;
i) storage means for storing data of the electric power obtained by said operational means;
j) frequency changing means for changing frequencies of the AC voltage applied to each said vibration generator;
k) control means for controlling the operation of the apparatus so that in an automatic setting mode, said operational means obtains the electric power supplied to each said vibration generator after the frequency of the AC voltage is increased or decreased by said frequency changing means at predetermined intervals in the condition that the effective value of the AC voltage applied to each said vibration generator is rendered constant, thereby comparing the value obtained by said operational means with the last obtained value, the data of which is stored in said storage means, whereby the AC voltage frequency is repetitively increased or decreased in the same direction that the present obtained power varies relative to the last obtained power, when the present power value obtained by said operational means is larger than the last obtained power value and the AC voltage frequency is repetitively increased or decreased in the direction opposite to the direction that the present obtained power varies relative to the last obtained power, when the present obtained power value is smaller than the last obtained power value, thereby obtaining the resonant frequency at which the electric power supplied to each said vibration generator reaches the maximum so that a feeding operation is performed at the resonant frequency, wherein said control means controls the operation of the apparatus over an entire operation period thereof in the automatic setting mode; and l) voltage regulating means for regulating the voltage applied to each said vibration generator, wherein said control means controls said voltage regulating means so that the voltage applied to each said vibration generator is regulated so that the obtained values of the electric power supplied to each said vibration generator at the resonant frequency is constant in the automatic setting mode every time the resonant frequency is obtained; and m) an alarm means for alarming when the resonant frequency is obtained.

5. A vibratory feeding apparatus according to claim 4, which further comprises mode selecting means for manually selecting either the automatic setting mode or a manual setting mode and manual frequency adjusting means for manually adjusting the frequency of the voltage applied to each said piezoelectric element in the manual setting mode and wherein said operational means obtains the value of the electric power supplied to each said piezoelectric element every time the frequency of the voltage applied to each said piezoelectric element is regulated by said frequency regulating means and said control means compares the electric power value obtained by said operational means with the last electric power value whose data is stored in said storage means, thereby determining whether or not the electric power supplied to each said piezoelectric element reaches the maximum, said control means controlling said alarm means based on the determined result.

6. A vibratory feeding apparatus comprising:
a) a DC power supply rectifying a commercial AC voltage to thereby supply a DC high voltage:
b) invertor means for inverting the DC high voltage supplied from said DC power supply to AC voltage;
c) a plurality of piezoelectric elements for generating vibrations when the AC voltage is applied thereto;
d) feeding means vibrated by each said piezoelectric element, thereby feeding articles;
e) means for obtaining a mean value of the DC voltage applied to said invertor means;
f) means for obtaining a mean value of the direct current supplied to said invertor means;
g) operational means for obtaining a value of electric power supplied to each said piezoelectric element from the value of the DC voltage and the mean value of the direct current;

h) storage means for storing data of the value of electric power obtained by said operational means;

i) frequency changing means for changing output frequencies of said invertor means; and j) control means for controlling the operation the apparatus so that in an automatic setting mode, said operational means obtains the electrical power supplied to each said piezoelectric element after the frequency of the AC voltage is increased or decreased by said frequency changing means at predetermined intervals in the condition that the effective value of the AC voltage applied to each said piezoelectric element is rendered constant, thereby comparing the value obtained by said operational means with the last obtained value, the data of which is stored in said storage means, whereby the AC voltage frequency is repetitively increased or decreased in the same direction that the present obtained power varies relative to the last obtained power, when the present power value obtained by said operational means is larger than the last obtained power value and the AC voltage frequency is repetitively increased or decreased in the direction opposite to the direction that the present obtained power varies relative to the last obtained power, when the present obtained power value is smaller than the last obtained power value, thereby obtaining the resonant frequency at which the electrical power supplied to each said piezoelectric element reaches the maximum so that the feeding operation is performed at the resonant frequency.

7. A vibratory feeding apparatus according to claim 6, wherein said control means controls the feeding operation over an entire operation period thereof in the automatic setting mode.

8. A vibratory feeding apparatus according to claim 7, which further comprises voltage regulating means for regulating the output voltage of said inverter means and wherein said control means controls the output voltage of said inverter means through said voltage regulating means so that the obtained value of the input voltage to said inverter means is constant at the resonant frequency in the automatic setting mode every time the resonant frequency is obtained.

9. A vibratory feeding apparatus comprising:

a) a DC power supplying rectifying a commercial AC power to thereby supply a DC high voltage;

b) inverter means for inverting the DC high voltage supplied from said DC power supply to AC voltage;

c) a plurality of vibration generators for generating vibrations when the AC voltage is applied thereto;

d) feeding means vibrated by each said vibration generator, thereby feeding articles;

e) means for obtaining a value of the DC voltage applied to said inverter means;

f) means for obtaining a means value of the direct current supplied to said inverter means;

g) operational means for obtaining a value of electric power supplied to each said vibration generator from the value of the DC voltage and the mean value of the direct current;

h) storage means for storing data of the value of electric power obtained by said operational means;

i) frequency changing means for changing output frequencies of said inverter means; and j) control means for controlling the operation of the apparatus so that in an automatic setting mode, said operational means obtains the electrical power supplied to each said vibration generator after the frequency of the AC voltage is increased or decreased by said frequency changing means at predetermined intervals in the condition that the effective value of the AC voltage applied to each said vibration generator is rendered constant, thereby comparing the value obtained by said operational means with the last obtained value, the data of which is stored in said storage means, whereby the AC voltage frequency is repetitively increased or decreased in the same direction that the present obtained power varies relative to the last obtained power, when the present power value obtained by said operational means is larger than the last obtained power value and the AC voltage frequency is repetitively increased or decreased in the direction opposite to the direction that the present obtained power varies relative to the last obtained power, when the present obtained power value is smaller than the last obtained power value, thereby obtaining the resonant frequency at which the electrical power supplied to each said vibration generator reaches the maximum so that the feeding operation is performed at the resonant frequency, wherein said control means controls the feeding operation over an entire operation period thereof in the automatic setting mode;

k) voltage regulating means for regulating the output voltage of said inverter means and wherein said control means controls the output voltage of said inverter means through said voltage regulating means so that the obtained value of the input voltage to said inverter means is constant at the resonant frequency in the automatic setting mode every time the resonant frequency is obtained; and l) an alarm means for alarming when the resonant frequency is obtained.

10. A vibratory feeding apparatus according to claim 9, which further comprises mode selecting means for manually selecting either the automatic setting mode or a manual setting mode and manual frequency adjusting means for manually adjusting the frequency of the output voltage of said inverter means in the manual setting mode and wherein said operational means obtains the value of the electric power supplied to said inverter means every time the inverter output voltage frequency is adjusted by said frequency adjusting means and said control means compares the electric power value obtained by said operational means with the last electric power value whose data is stored in said storage means, thereby determining whether or not the inverter input power reaches the maximum, said control means controlling said alarm means based on the determined result.

* * * * *